(12) United States Patent
Obara

(10) Patent No.: US 6,463,264 B1
(45) Date of Patent: Oct. 8, 2002

(54) WIRELESS COMMUNICATION APPARATUS AND TRANSMISSION POWER CONTROL METHOD IN WIRELESS COMMUNICATION APPARATUS

(75) Inventor: Toshio Obara, Kanagawa (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 09/459,273

(22) Filed: Dec. 13, 1999

(30) Foreign Application Priority Data

Jan. 8, 1999 (JP) .......................................... 11-003072

(51) Int. Cl.$^7$ ............................................. H01Q 11/12
(52) U.S. Cl. ...................................... 455/127; 455/126
(58) Field of Search ........................... 455/69, 522, 126, 455/127

(56) References Cited

U.S. PATENT DOCUMENTS

| | | |
|---|---|---|
| 5,126,688 A | 6/1992 | Nakanishi et al. |
| 5,507,017 A * | 4/1996 | Whitmarsh et al. ......... 455/126 |
| 5,642,378 A | 6/1997 | Denheyer et al. |
| 5,752,171 A * | 5/1998 | Akiya ........................ 455/126 |
| 6,304,749 B1 * | 10/2001 | Obara ........................ 455/126 |

* cited by examiner

*Primary Examiner*—Nguyen T. Vo
*Assistant Examiner*—Nghi H. Ly
(74) *Attorney, Agent, or Firm*—Pearne & Gordon LLP (57) ABSTRACT

A transmission power control in a wireless communication, in that based upon transmission power designation information "A" functioning as a power control target derived from a transmission power designating unit 16, a transmission power error "E" is detected from a difference between a detection value "D" of an outputted transmission signal and a power control target value "C". This transmission power error "E" is multiplied by a loop gain "G" of a feedback loop set by a loop gain setting unit 22 so as to produce a feedback correction value "F". The transmission power control is carried out based on the feedback correction value "F". Furthermore, a suitable bias voltage "J" is outputted from a bias voltage producing unit 17 in response to the transmission power designation information "A" so as to reduce power consumption, and also, a gain variation of a power amplifier 13, which is caused by this bias current control, is compensated by a gain variation compensating unit 26 in response to the transmission power designation information "A".

9 Claims, 6 Drawing Sheets

WIRELESS COMMUNICATION APPARATUS AND TRANSMISSION POWER CONTROL METHOD IN WIRELESS COMMUNICATION APPARATUS

BACKGROUND OF THE INVENTION

The present invention is related to a wireless (radio) communication apparatus for performing a mobile communication in a portable telephone, related to a transmission power control method used in this wireless communication apparatus, and also related to a recording medium for recording thereon a program used to execute the transmission power control method.

In general, mobile communication appliances such as portable telephone units are equipped with functions capable of controlling transmission power of own units based upon distances between base stations and mobile stations while information is transmitted. In the multiple access type communication system for multiplexing a plurality of communication channels at the same frequency, a transmission power control for controlling power of a signal reached to a base station at a necessary minimum value is necessarily required in order to increase a frequency utilization efficiency, depending upon interference power amounts between communication channels.

More specifically, in a CDMA (Code Division Multiple Access) type mobile communication appliance with employing a spread spectrum technique, there are great possibilities that a signal having low transmission power is masked by a signal having high transmission power, namely a so-called "far/near problem" occurs. To solve such a problem, conventionally, the transmission power control with a high linearity and a wide dynamic range (for instance, 70 to 80 dB) is required. In the wide-band CDMA (W-CDMA), higher precision of the transmission power is required when signals having high power are transmitted, and thus, higher precision of the transmission power controls is further required. This wide-band CDMA system has been considered as the mobile communication system for the next generation.

As described above, in such a case that the mobile station is located in the vicinity of the base station in the system operation of the above wireless communication apparatus, there is a certain possibility that the transmission power of both the mobile station and the base station is lowered by way of the transmission power control. At the same time, the power consumption of the transmitter can be reduced by controlling the current consumption of the power amplifier.

However, in the above-described conventional wireless communication apparatus, when the current consumption control for the power amplifier is realized by the bias current control and the like, there is a variation in the gains caused by changing the biasing point. As a result, since the high-linearity power control corresponding to the system requirement condition can be hardly carried out, generally speaking, the power amplifier is used under the fixed biasing control.

As a consequence, in order to reduce the power consumption of the transmitter while realizing the high-linearity power control, there is a limitation in the conventional wireless communication apparatus such that the current consumption of the power amplifier operated under low output is lowered. In particular, the low power consumption of the transmitter may constitute a major subject in view of extension of communication available time of a mobile station.

SUMMARY OF THE INVENTION

The present invention has been made to solve the above-described problems of the prior art, and therefore, has an object to provide a wireless communication apparatus, a transmission power control method used in the wireless communication apparatus, and a recording medium, capable of securing absolute precision of required transmission power (i.e., allowable error with respect to power control target value), and furthermore, capable of realizing a high-linearity transmission power control with a wide dynamic range, while reducing power consumption of an electronic appliance by adjusting a current consumption of a power amplifier operated under low output power.

To achieve the above-described object, a wireless communication apparatus according to the present invention comprises: transmission power designating means for designating transmission power of a transmission signal to be transmitted from the wireless communication apparatus; controlling reference value producing means for producing a reference value used to control transmission power based upon the designated transmission power; timing control means for defining control timing of the transmission power; error detecting means for detecting an error based upon a difference value between a detection value obtained by detecting the transmission signal of the wireless communication apparatus and a detection value of a transmission signal when the transmission signal is transmitted under the designated transmission power; gain multiplying means for multiplying the detected error by a predetermined gain to obtain a correction value; control amount producing means for producing a feedback control amount based upon the correction value; power adjusting means for again setting a gain in a transmission power amplification at the control timing based upon the reference value for controlling the transmission power and the feedback control amount so as to adjust the transmission power; power amplifying means for power-amplifying the transmission signal; current consumption adjusting means for adjusting a current consumption in such a manner that a bias voltage is applied to the power amplifying means in response to the designated transmission power so as to control a bias current in the power amplifying means; and gain variation compensating means for compensating a variation in gains when the variation of the gains occurs in the transmission power amplification by controlling the bias current.

Also, in the wireless communication apparatus as above mentioned, the gain variation compensating means includes gain adjusting means for adjusting both the reference value used to control the transmission power and the gain control value based on the feedback control amount in response to the designated transmission power in the power adjusting means.

Also, the wireless communication apparatus as above mentioned, the gain variation compensating means includes compensation amount producing means for producing a gain variation compensation amount in response to the designated transmission power; and variable gain means for varying a gain based upon the gain variation compensation amount at output means of the power adjusting means.

Also, the wireless communication apparatus as above mentioned, the gain variation compensating means includes compensation amount producing means for producing a gain variation compensation amount in response to the designated transmission power; and signal amplitude varying means for varying a signal amplitude of the transmission signal based on the gain variation compensation amount.

A transmission power control method used in a wireless communication apparatus, according to the present invention comprises: a transmission power designating step for designating transmission power of a transmission signal to be transmitted from the wireless communication apparatus; a controlling reference value producing step for producing a reference value used to control transmission power based upon the designated transmission power; a timing control step for defining control timing of the transmission power; an error detecting step for detecting an error based upon a difference value between a detection value obtained by detecting the transmission signal of the wireless communication apparatus and a detection value of a transmission signal when the transmission signal is transmitted under the designated transmission power; a gain multiplying step for multiplying the detected error by a predetermined gain to obtain a correction value; a control amount producing step for producing a feedback control amount based upon the correction value; a power adjusting step for again setting a gain in a transmission power amplification at the control timing based upon the reference value for controlling the transmission power and the feedback control amount so as to adjust the transmission power; a power amplifying step for power-amplifying the transmission signal; a current consumption adjusting step for adjusting a current consumption in such a manner that a bias voltage is applied in response to the designated transmission power so as to control a bias current in the power amplifying step; and a gain variation compensating step for compensating a variation in gains when the variation of the gains occurs in the transmission power amplification by controlling the bias current.

Also, the transmission power control method as described above, the gain variation compensating step includes a gain adjusting step for adjusting both the reference value used to control the transmission power and the gain control value based on the feedback control amount in response to the designated transmission power in the power adjusting step.

Also, the transmission power control method as described above, the gain variation compensating step includes a compensation amount producing step for producing a gain variation compensation amount in response to the designated transmission power; and a variable gain step for varying a gain based upon the gain variation compensation amount at an output of the power adjusting step.

Also, the transmission power control method as above described, the gain variation compensating step includes a compensation amount producing step for producing a gain variation compensation amount in response to the designated transmission power; and a signal amplitude varying step for varying a signal amplitude of the transmission signal based on the gain variation compensation amount.

A recording medium readable by a computer, according to the present invention, is featured for recording thereon the transmission power control method used in the wireless communication apparatus as a program executed by the computer.

According to the present invention, the error is detected based upon the difference value between the detection value obtained by detecting the transmission signal of the wireless communication apparatus and the detection value of the transmission signal when this transmission signal is transmitted under the designated transmission power to be transmitted. Then, this error is multiplied by a predetermined gain to obtain the correction value. Based on this correction value, the feedback control amount is produced. At this time, a preselected gain is preferably set in such a manner that the variation amount of the transmission power controlled based on the feedback control amount may be located within the allowable range required for the variation amount of the transmission power which is controlled based upon the reference value of the transmission power control produced based on the designated transmission power. Then, based on both this feedback control amount and the reference value of the transmission power control, the gain of the transmission power amplification is again set at preselected control timing so as to control the transmission power. As a consequence, since the transmission power is continuously controlled within the continuously required allowable range of the variation amount, the absolute precision of the predetermined transmission power can be maintained while maintaining the linearity of the transmission power control characteristic. Also, since the bias current in the power amplifying means (power amplifying step) is controlled in response to the designated transmission power, the current consumption may be adjusted, and furthermore, the gain variation in the transmission power amplification caused by controlling this bias current may be compensated. As a consequence, the bias current may be optimized in response to the designated transmission power. In particular, when the transmission output power is low, since the current consumption is reduced, the power consumption may be lowered. Also, in the case that the gain is varied due to this bias current control, this variation amount of the gain may be compensated.

Further, according to the present invention, both the reference value of the transmission power control and the gain control value based on the feedback control amount are adjusted by the power adjusting means (power adjusting step) in response to the designated transmission power. As a result, the gain variation caused by the bias current control may be properly compensated in accordance with the transmission output power.

Furthermore, according to the present invention, the gain variation compensation amount is produced in response to the designated transmission power, and the gain is varied at the output of the power adjusting means (power adjusting step) based upon this gain variation compensation amount. As a result, the gain variation caused by the bias current control may be properly compensated in response to the transmission output power.

Moreover, according to the present invention, the gain variation compensation amount is produced in response to the designated transmission power, and the amplitude of the transmission signal is varied based upon this gain variation compensation amount. As a result, the gain variation caused by the bias current control may be properly compensated in response to the transmission output power.

DETAILED DESCRIPTION OF THE PREFERRED EMBODIMENTS

Now, a wireless communication apparatus, a transmission power control method used in the wireless communication apparatus, and a recording medium, according to embodiments of the present invention, will be described with reference to drawings in detail. It should be understood that while both the wireless communication apparatus and the transmission power control method used in this wireless communication apparatus according to the present invention are explained in detail, since the recording medium according to the present invention corresponds to such a recording medium for recording thereon a program used to execute the transmission power control method, the description of this recording medium is involved in the below-mentioned explanation about this transmission power control method.

First Embodiment

Figure 1:
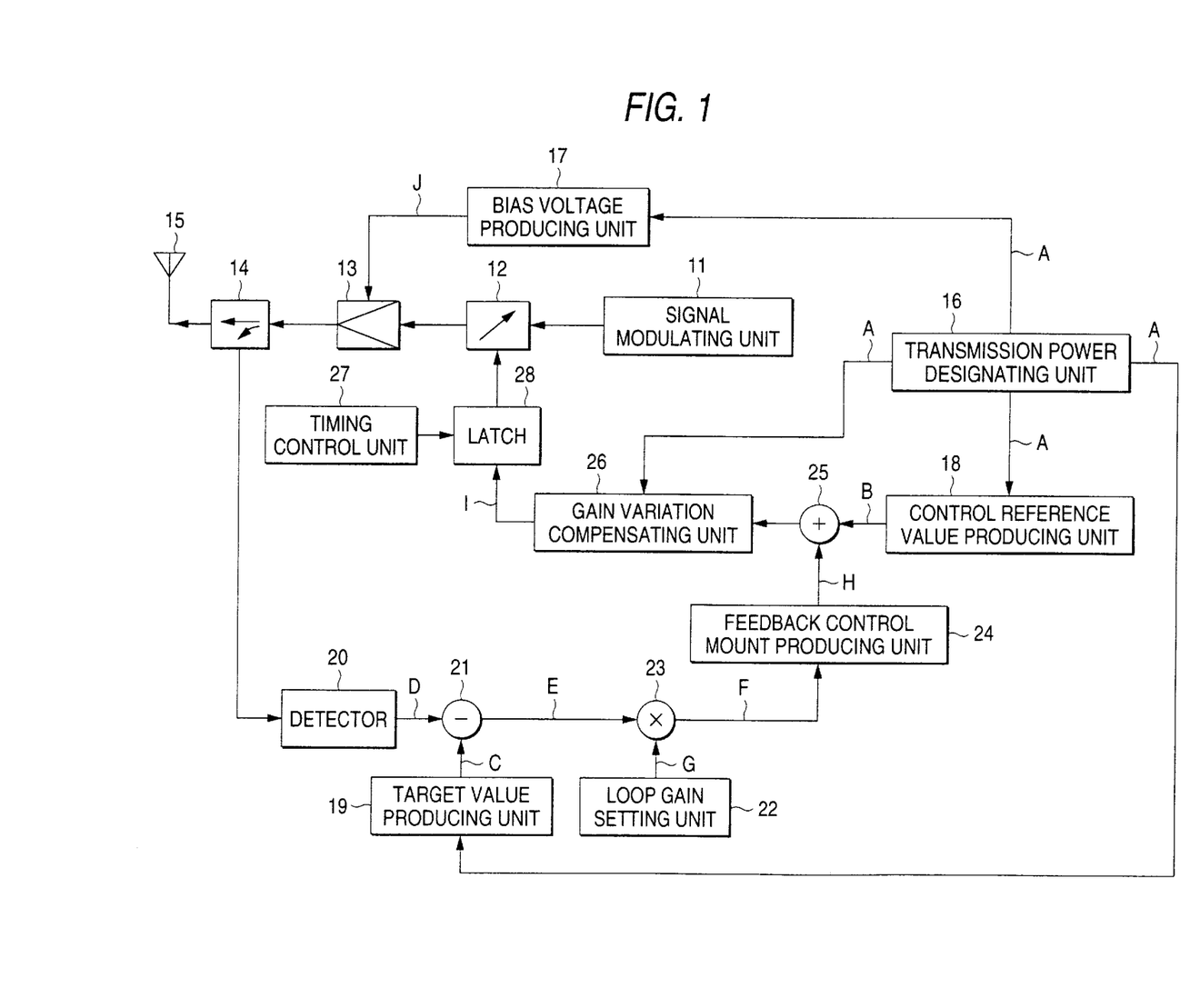
FIG. 1 is a structural diagram for mainly indicating an arrangement of a transmission power control unit of a wireless communication apparatus according to a first embodiment of the present invention.

FIG. 1 is a structural diagram for indicating an arrangement of a wireless communication apparatus according to a first embodiment of the present invention by mainly showing a transmission power control unit thereof. The wireless communication apparatus according to this embodiment is employed in, for instance, a mobile communication appliance and the like, which constitute either a base station or a mobile station in a cellular communication system. The wireless communication apparatus power-amplifies a signal containing transmission information, and then transmits the power-amplified signal to a communication party. In this embodiment, the mobile station is employed as a concrete example, and transmission power control of the wireless communication apparatus in this mobile station will be described. However, the present invention is not limited to this concrete example, but may be applied to, for instance, a base station.

In FIG. 1, the wireless communication apparatus of this embodiment contains, as a basic transmission system, a signal modulating unit 11, a variable gain circuit (AGC) 12, a power amplifier 13, a directional coupler 14, and a transmission antenna 15. The signal modulating unit 11 modulates a transmission signal containing transmission information. The variable gain circuit 12 variably controls a transmission power amplification gain of the transmission signal. The power amplifier 13 power-amplifies the modulated transmission signal to output this power-amplified transmission signal. The directional coupler 14 derives a portion of transmission power of the power-amplified transmission signal. the transmission antenna 15 radiates the power-amplified transmission signal.

Also, in this drawing, the wireless communication apparatus of this embodiment is equipped with a first control system for constituting a feedback loop used to perform a transmission power control related to a compensation for transmission power precision. As this first control system, the wireless communication apparatus contains a transmission power designating unit 16, a control reference value producing unit 18, a target value producing unit 19, a detector 20, an error detecting unit 21, a loop gain setting unit 22, a loop gain multiplying unit 23, a feedback control amount producing unit 24, a control variable adding unit 25, a timing control unit 27, and a latch 28.

Furthermore, in this drawing, the wireless communication apparatus of this embodiment is equipped with a second control system capable of reducing power consumption by controlling a bias of a power amplifier when the power amplifier is operated under low output power. As this second control system, the wireless communication apparatus contains a bias voltage producing unit 17 and a gain variation compensating unit 26.

The transmission power designating unit 16 corresponds to a transmission power designating means, and outputs transmission power designation information "A" to be transmitted, which constitutes a target of power control, based upon transmission power controlling data sent from a base station. Also, the timing control unit 27 corresponds to a timing control means, and produces a timing control signal of a single feedback control (will be referred to as a "1 control step" hereinafter) by which control timing of transmission power should be defined. Also, the control reference value producing unit 18 corresponds to a controlling reference value producing means, and produces a reference value "B" of a transmission power control upon receipt of the transmission power designation information "A" derived from the transmission power designating unit 16. In other words, the transmission power controlling reference value "B" is a reference value of a control signal which is supplied to the variable gain circuit 12 by the single feedback control.

Further, the target value producing unit 19, the detector 20, and the error detecting unit 21 correspond to an error detecting means. A difference value between a detection value "D" and a power control target value "C" is calculated by the error detecting unit 21. This detection value "D" is obtained by detecting the output of the directional coupler 14 by the detector 20. The power control target "C" is used to detect the error based upon the transmission power designation information "A" produced by the target value producing unit 19. Thus, a transmission power error "E" is detected. It should be noted that the power control target value "C" is equal to a detection value of such a transmission signal when this transmission signal is transmitted under designated transmission power which constitutes a control target. While the detection value which have been previously measured every time the transmission power is designated are saved in a form of a table into the target value producing unit 19, the relevant detection value is outputted by referring to this table based upon the transmission power designation information "A".

Also, both the loop gain setting unit 22 and the loop gain multiplexing unit 23 correspond to a gain multiplexing means. A loop gain "G" of a feedback loop set by the loop gain setting unit 22 is multiplied by the transmission power error "E" outputted from the error detecting unit 21 so as to calculate a feedback correction value "F" corresponding to the correction value. The feedback correction amount producing unit 24 corresponds to a control amount producing means, and produces a feedback control amount "H" based upon the feed back correction value "F". It should also be noted in the loop gain setting unit 22 that the loop gain "G" is set as follows. This loop gain "G" may be limited within an allowable range which is required for the variation amount of the transmission power adjusted based upon the feedback control amount "H" with respect to the variation amount of the transmission power adjusted based on the transmission power control reference value B.

Also, the control variable adding unit 25, the latch 28, the variable gain circuit 12, and the power amplifier 13 correspond to a power adjusting means. The transmission power control reference value "B" is added to the feedback control amount "H" by the control variable adding unit 25. After the added result if latched by the latch 28, the content of this latch 28 is supplied to the variable gain circuit 12 in response to the timing control signal produced by the timing control unit 27, and the input power of the power amplifier 13 is again set so as to adjust the transmission power.

Further, the bias voltage producing unit 17 corresponds to a consumption current adjusting means, and outputs an optimum bias voltage "J" of the power amplifier 13 in accordance with the transmission output power. Also, the gain variation compensating unit 26 corresponds to such a gain adjusting means equal to a gain variation compensating means recited in a scope of claim for a patent. The output of the control variable adding unit 25 is adjusted in such a manner that the gain variation compensation amount of the power amplifier 13, which is produced by controlling the bias current of the bias voltage producing unit 17, may be reflected onto the control amount of the variable gain circuit 12. Then, the adjusted output is supplied as a gain control value I to the latch 28.

In the bias voltage producing unit 17, the optimum bias voltage values of the power amplifier 13 are previously acquired in accordance with the transmission output power, and then, these acquired optimum bias voltage values are saved in a table and the like. A bias voltage "J" suitable for transmission output power is outputted from this bias voltage producing unit 17 with reference to this table based upon the transmission power designation information "A". Also, in the gain variation compensating unit 26, error amounts from predicted gain values of the power amplifier are previously acquired in accordance with the transmission output power, and then, the acquired error amounts are saved in a table and the like. The gain control value "I" of the output from the control variable adding unit 25 is adjusted by the gain variation compensating unit 26 in response to the output obtained with reference to this table based upon the transmission power designation information "A". Then, the gain variation compensation amount caused by controlling the bias current of the power amplifier 13 may be reflected onto the control amount of the variable gain circuit 12, and then, the resulting control amount is latched in the latch 28. The above-explained method for controlling the low power consumption of the power amplifier may constituted the feature of the wireless communication apparatus according to this embodiment.

It should also be understood that each of these functional blocks of the transmission power designating unit 16, the control reference value producing unit 18, the target value producing 19, the loop gain setting unit 22, the bias voltage producing unit 17, and the gain variation compensating unit 26 is arranged by a microprocessor (MPU) and the like. A series of control operations executed in the transmission power control unit may be realized by a software program executable on this MPU.

Figure 2:
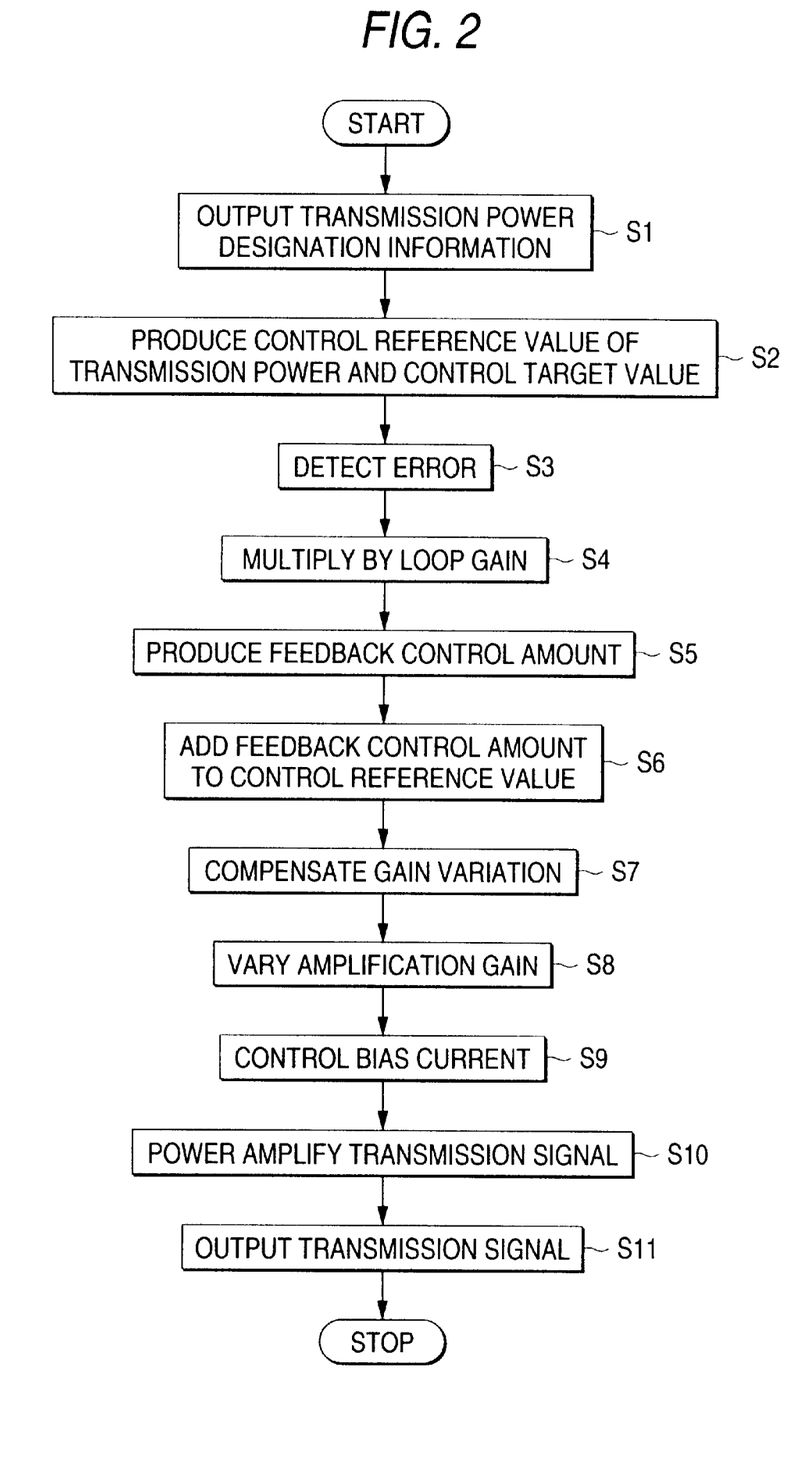
FIG. 2 is a flow chart for representing a transmission power control method used in a wireless communication apparatus according to this embodiment.
Figure 3:
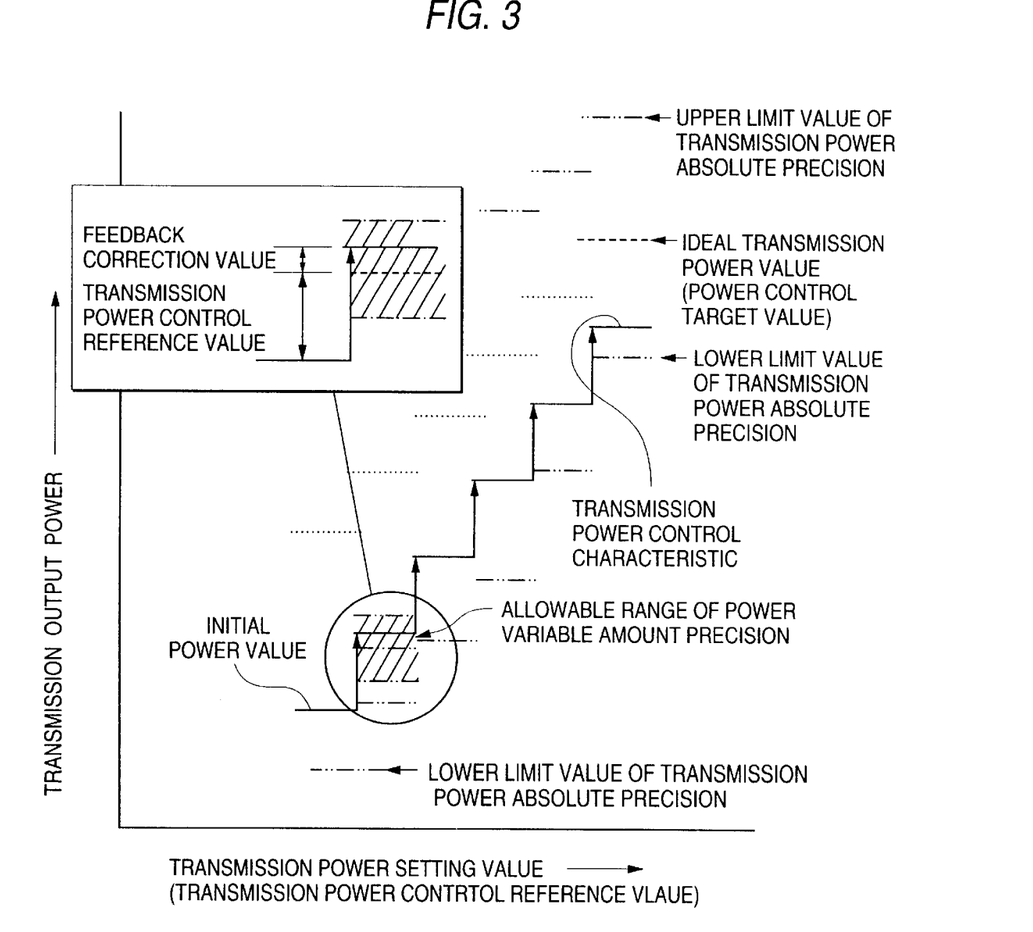
FIG. 3 is an operation explanatory diagram for representing a relationship between a transmission power setting value and transmission output power.
Figure 4:
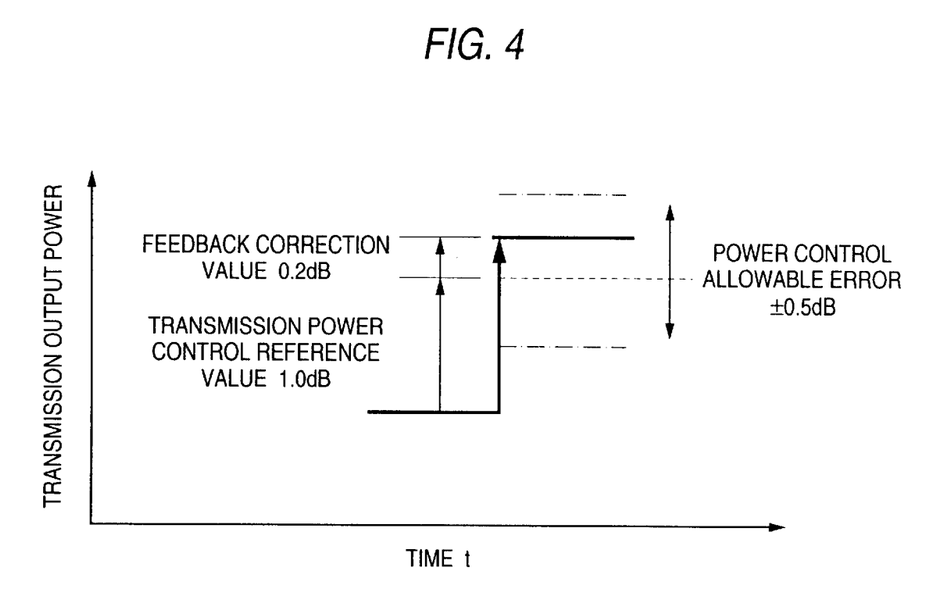
FIG. 4 is a diagram for explaining an example of a method for setting a loop gain.

Next, operations of the transmission power control unit with employment of the above-described arrangement will now be described. FIG. 2 is a flowchart for showing a transmission power control method used in the wireless communication apparatus according to this embodiment. FIG. 4 is an operation explanatory diagram for describing a relationship between a transmission power setting value (corresponding to transmission power designation information) and transmission output power. FIG. 4 is a diagram for explaining an example of a method for setting a loop gain.

For instance, in a CDMA type mobile communication appliance, a high-linearity transmission power control with a wide dynamic range is strongly desired, and a linear power control operation must be carried out over a wide range while transmission power is increased/decreased. In particular, in the wide-band CDMA (W-CDMA) system expected as the next generation mobile communication system, the predetermined transmission power absolute precision is required over the entire area, and when high transmission power is outputted, higher transmission power absolute precision is needed. In this case, the term "transmission power absolute precision" corresponds to an allowable error with respect to a power control target value "C".

The below-mentioned description is exemplified by such a case that while maximum transmission output power is selected as 0.3 W, transmission power is controlled in a range of 70 dB. It is now assumed that the transmission power absolute precision (i.e., allowable error with respect to power control target value) is selected to be, for example, +2 dB and −2 dB in high transmission power (more than +20 dBm), and selected to be, for instance, +4 dB and −4 dB is low transmission power (less than +20 dBm). Also, as to the linearity of transmission power control, for instance, while the transmission power is varied by 1 dB per a 1 control step, power variable amount precision (i.e., allowable error contained in transmission power control with respect to variable range) of +0.5 dB and −0.5 dB is maintained.

When the transmission power is controlled, the transmission power designation information "A" which constituted the power control target to be transmitted to the respective blocks to which the control lines are connected is outputted from the transmission power designating unit 16 (step S1). Upon receipt of this transmission power designation information "A", the transmission power control reference value "B" of the 1 control step is produced in the control reference value producing unit 18, and the power control target value "C" which constituted a convergent target of a power precision compensation is produced in the target value producing unit 19 (step S2). The transmission power control reference value "B" is a reference value of a control signal to be supplied to the variable gain circuit 12 in order to the transmission output power (namely, ideal transmission power value shown in FIG. 3) designated by this transmission power designation information "A". This transmission power control reference value "B" is equivalent to a transmission power setting value indicated in an abscissa of FIG. 3. Also, the power control target value "C" is an output value of the detector 20 in the case that the above-designated transmission output power is acquired.

On the other hand, the transmission signal modulated by the signal modulating unit 11 is power-amplified by the power amplifier 13 by the gain which is again set by the variable gain circuit 12. At this time, the gain control of the transmission power amplification system is carried out by the variable gain circuit 12. Under initial condition, while the feedback control amount producing unit 24 is reset, the transmission power control reference value "B" is directly supplied from the control variable adding unit 24 to the gain variation compensating unit 26 and is further supplied as the gain control value "I" via the latch 26 to the variable gain circuit 12, so that the gain of the power amplification may be adjusted. Then, after the modulated transmission signal is power-amplified by the power amplifier 13, the power-amplified transmission signal is radiated via the directional coupler 14 from the transmission antenna 15 corresponding to the transmission power output terminal.

When the signal is transmitted, the transmission power of the transmission signal is detected by the directional coupler 14 by a constant attenuation amount, and then, the detection value "D" is obtained by the detector 20. Then, this detection value "D" outputted from the detector 20 is compared with, and subtracted from the power control target value "C" outputted from the target value outputting unit 19. Then, the present transmission power error "E" with respect to the power control target value "C" is detected (step S3).

In the loop gain setting unit 22, such a loop gain "G" is set to be stored, by which the power variable amount per 1 control step becomes a proper value (namely, 1±0.5 dB). The present transmission power error "E" is multiplied by the loop gain "G" by the loop gain multiplying unit 23 (step S4).

Now, a description will be made of an example of the method for setting the loop gain "G" with reference to FIG. 4. As previously explained, in this embodiment, since the feedback control of the transmission power is carried out under such a condition that the power control allowable error +0.5 dB and −0.5 dB can be satisfied with respect to the power variation of 1 dB, while setting the loop gain "G" as G<<1, the feedback correction value "F" is made sufficiently small with respect to the power variable amount per 1 control step, and furthermore, this feedback correction value "F" is gradually approximated to the control target value every time the control step is executed. Since (transmission power error "E")×(loop gain "G")=(feedback control value "F"), when the feedback correction value is selected to be 0.2 dB in such a manner that, for instance, the maximum power error value "Emax" calculated based on the transmission power absolute precision is equal to 4 dB, and the maximum value "Fmax" of the feedback correction value becomes smaller than 0.5 dB (i.e., Fmax<<0.5), the loop gain "G" becomes (Emax×G=Fmax) to (G=Fmax/Emax= 0.05).

The feedback correction value "F" outputted from the loop gain multiplying unit 23 is added to each other every 1 control step in the feedback control amount producing unit 24. The added feedback correction value is outputted as the feedback control amount "H" to the control variable adding unit 25 (step S5). Then, the transmission power control reference value "B" is added to the feedback control amount "H" in the control variable adding unit 25 (step S6). The added value is entered into the gain variation compensating unit 26 so as to be adjusted based upon the gain variation compensation amount of the power amplifier 13 in response to the transmission power designation information "A" (step S7). This gain-variation-compensated value is entered as the gain control value "I" via the latch 28 to the variable gain circuit 12. It should be noted that at this time, the timing control signal is outputted every time a time period has passed which is equal to the 1 control step preset in the timing control unit 27, and the output of the gain variation compensating unit 26 is latched by the latch 28 with respect to a 1 control step period. In the variable gain circuit 12, the amplification gain is varied based upon the input value derived from the latch 28 (step S8).

Also, the power bias voltage "J" produced in response to the transmission power designation information "A" is outputted from the bias voltage producing unit 17, so that the bias current control operation is carried out in accordance with the transmission output power in the power amplifier 13 (step S9). Under this condition, the transmission signal is power-amplified by the power amplifier 13 based upon the output of the variable gain circuit 12 (step S10), and the power-amplified transmission signal is outputted via the directional coupler 14 from the transmission antenna 15 (step S11).

While the above-described bias current control operation and gain variation compensation are carried out, the feedback control process operations defied at the steps S1 to S11 are repeatedly performed. As a result, the transmission power error "E" is gradually decreased to be finally approximated to the control target value, so that the predetermined transmission output power corresponding to the transmission power designation information "A" can be obtained.

In accordance with this embodiment, while the value to which a small amount of feedback correction value "F" has been added every 1 control step is fed back as the feedback control amount "H", the feedback control amount is gradually approximated to the control target value at a plurality of control steps. As a consequence, the transmission power control with high linearity can be maintained, and moreover, the desirable transmission power absolute precision can be obtained. Furthermore, while the consumption current of the power amplifier is reduced in particular when this power amplifier is operated under low output power by controlling the bias current in the power amplifier, the error contained in the transmission output power can be compensated which is caused by controlling this bias current. As a result, the power consumption can be lowered, as well as the high-linearity transmission power control with the wide dynamic range can be realized.

As a consequence, while the transmission power control operation is carried out, even when such a power amplifier whose gain is varied by controlling the bias current is employed, this gain variation can be compensated. Therefore, both the transmission power absolute precision and the power variable amount relative precision while the transmission power is varied can be maintained under better conditions even when any types of designated transmission power and any types of feedback controls are employed.

As previously described, in accordance with this embodiment, while the consumption current of the power amplifier can be reduced by controlling the bias current, the gain variation can be compensated in correspondence with this bias current control. As a consequence, while the power consumption of the electronic appliance can be lowered, the required absolute precision of the transmission power can be maintained. Also, the high-linearity transmission power control with the wide dynamic range can be realized.

Second Embodiment

Figure 5:
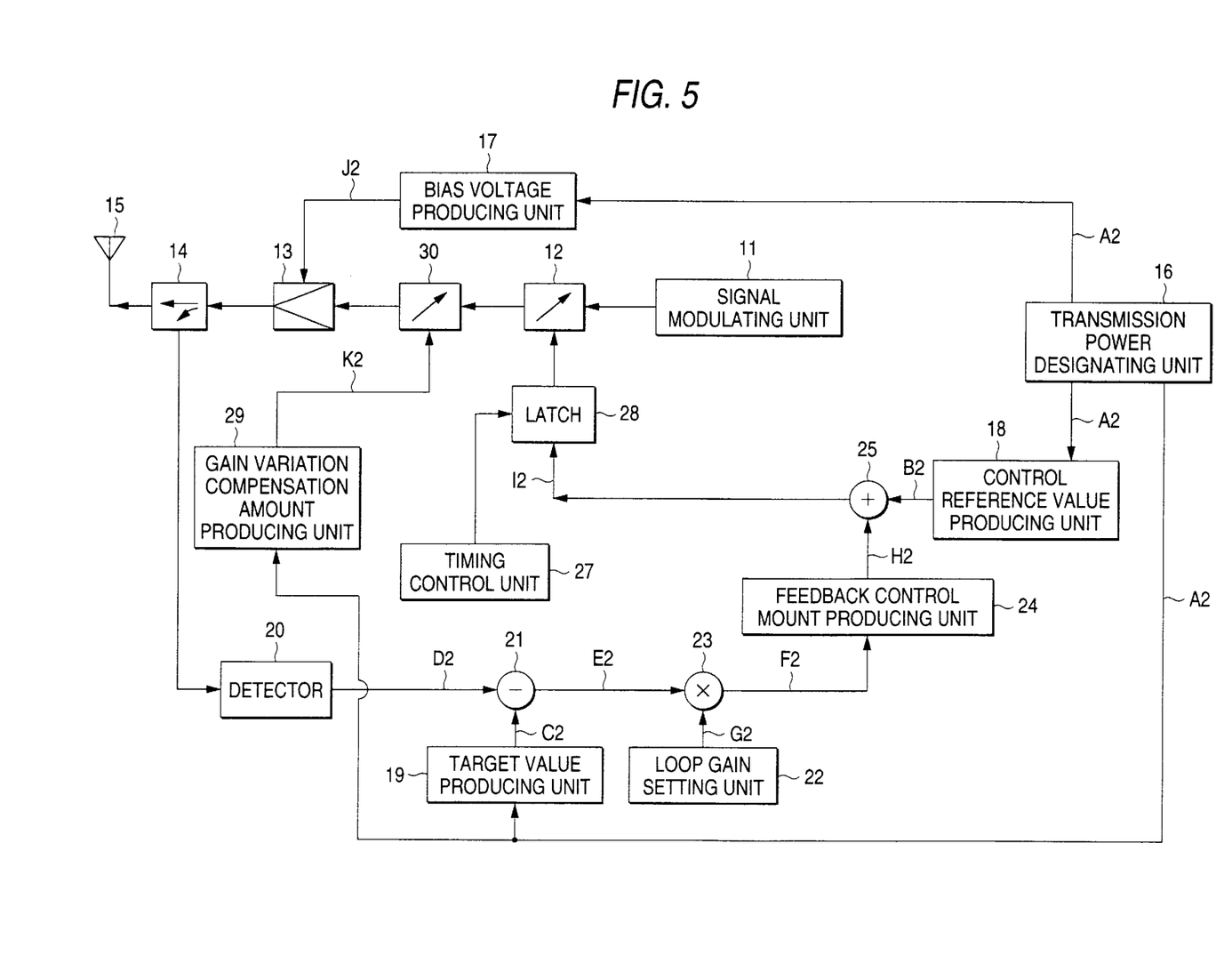
FIG. 5 is a structural diagram for mainly showing an arrangement of a transmission power control unit of a wireless communication apparatus according to a second embodiment of the present invention.

FIG. 5 is a structural diagram for mainly showing an arrangement of a transmission power control unit of a wireless communication apparatus according to a second embodiment of the present invention.

The second embodiment corresponds to a modified arrangement of the second control system related to the above-described bias current control operation and gain variation compensating operation. The arrangements of other portions and the effects thereof according to the second embodiment are similar to those of the first embodiment. Accordingly, only different point will be explained. the same reference numerals shown in the first embodiment will be employed as those for denoting the same, or similar structural elements of the second embodiment, and therefore, descriptions thereof are omitted.

In accordance with the second embodiment, as a second control system of the wireless communication apparatus, there are provided a bias voltage producing unit 17 corresponding to a current consumption adjusting means, and a gain variation compensation amount producing unit 29 and also a variable gain circuit 30, which correspond to a gain variation compensating means. This second control system is employed so as to reduce power consumption by controlling a bias of a power amplifier when this power amplifier is operated under low output power. The bias voltage producing unit 17 outputs an optimum bias voltage "J2" of a power amplifier 13 in response to transmission output power. The gain variation compensation amount producing unit 29 corresponds to a compensation amount producing means, and the variable gain circuit 30 corresponds to a variable gain means. In order that the gain variation compensation amount of the power amplifier 13, which is produced by the above-explained bias current control, may be reflected onto the variable gain circuit 30 for compensating the gain variation, a gain variation compensation amount "K2" is outputted from the gain variation compensation amount producing unit 29 based upon the transmission power designation information "A2" derived from the transmission power designating unit 16. Then, the gain variation compensation operation is carried out by this gain variation compensation amount "K2".

In the bias voltage producing unit 17, similar to the first embodiment, the optimum bias voltage values of the power amplifier 13 are previously acquired in accordance with the transmission output power, and then, these acquired optimum bias voltage values are saved in a table and the like. A bias voltage "J2" suitable for transmission output power is outputted from this bias voltage producing unit 17 with reference to this table based upon the transmission power designation information "A2". Also, in the gain variation compensation amount producing unit 29, variable gain circuit control amounts equivalent to error amounts from predicted gain values of the power amplifier are previously acquired in accordance with the transmission output power, and then, the acquired error amounts are saved in a table and the like. The gain variation compensation amount "K2" is supplied to the variable gain circuit 30 for compensating the gain variation so as to adjust the gain with reference to this table based upon the transmission power designation information "A2". Then, the gain variation compensation operation is performed at the output stage of the variable gain circuit 12.

It should also be understood that each of these functional blocks of the bias voltage producing unit 17, and the gain variation compensation amount producing unit 29 is arranged by a microprocessor (MPU) and the like. A series of control operations executed in the transmission power control unit may be realized by a software program executable on this MPU.

Similar to the first embodiment, when the transmission power control operation is carried out, based upon transmission power designation information "A2" which constitutes a power control target to be transmitted from the transmission power designating unit 16, a transmission power control reference value "B2" of the 1 control step is produced from the control reference value producing unit 18. In addition, a power control target value "C2" which constitutes a convergent target of the power precision compensation is produced by the target value producing unit 19. Then, a detection value "D2" outputted from the detector 20 is compared with, and is subtracted from a power control target value "C2" outputted from the target value producing unit 19 in the error detecting unit 21, so that a present transmission power error "E2" with respect to the power control target value "C2" is detected. Also, a transmission power error "E2" is multiplied by a loop gain "G2" by the loop gain multiplying unit 23 so as to obtain a feedback correction value "F2". This feedback correction value "F2" is added to each other every 1 control step in the feedback control amount producing unit 24, and then, the added feedback correction value is outputted as a feedback control amount "H2" to the control variable adding unit 25. Furthermore, the transmission power control reference value "B2" is added to the feedback control amount "H2" in the control variable adding unit 25, and then, the added value is entered as a gain control value "I2" via the later 28 to the variable gain circuit 12.

In accordance with the second embodiment, the gain is adjusted in response to the transmission power designation information "A2" with respect to the output from the variable gain circuit 12 by both the gain variation compensation amount producing unit 29 and the variable gain circuit 30 for compensating the gain variation, and furthermore, the gain variation compensation operation for the power amplifier 13 is carried out by these circuits. Then, the proper bias voltage "J2" produced in response to the transmission power designation information "A2" is outputted from the bias voltage producing unit 17, so that the bias current control operation is carried out in accordance with the transmission output power in the power amplifier 13. Under this condition, the transmission signal is power-amplified by the power amplifier 13 based upon the output of the variable gain circuit 30, and the power-amplified transmission signal is outputted via the directional coupler 14 from the transmission antenna 15.

As previously explained, also in the second embodiment, similar to the first embodiment, since the bias voltage in the power amplifier is controlled, in particular, while the current consumption occurred when the power amplifier is operated under low output power can be reduced, the error contained in the transmission output power caused by the gain variation due to this bias current control can be compensated in accordance with the transmission output power. As a result, the low power consumption can be realized, and furthermore, the high-linearity transmission power control with the wide dynamic range can be realized.

Third Embodiment

Figure 6:
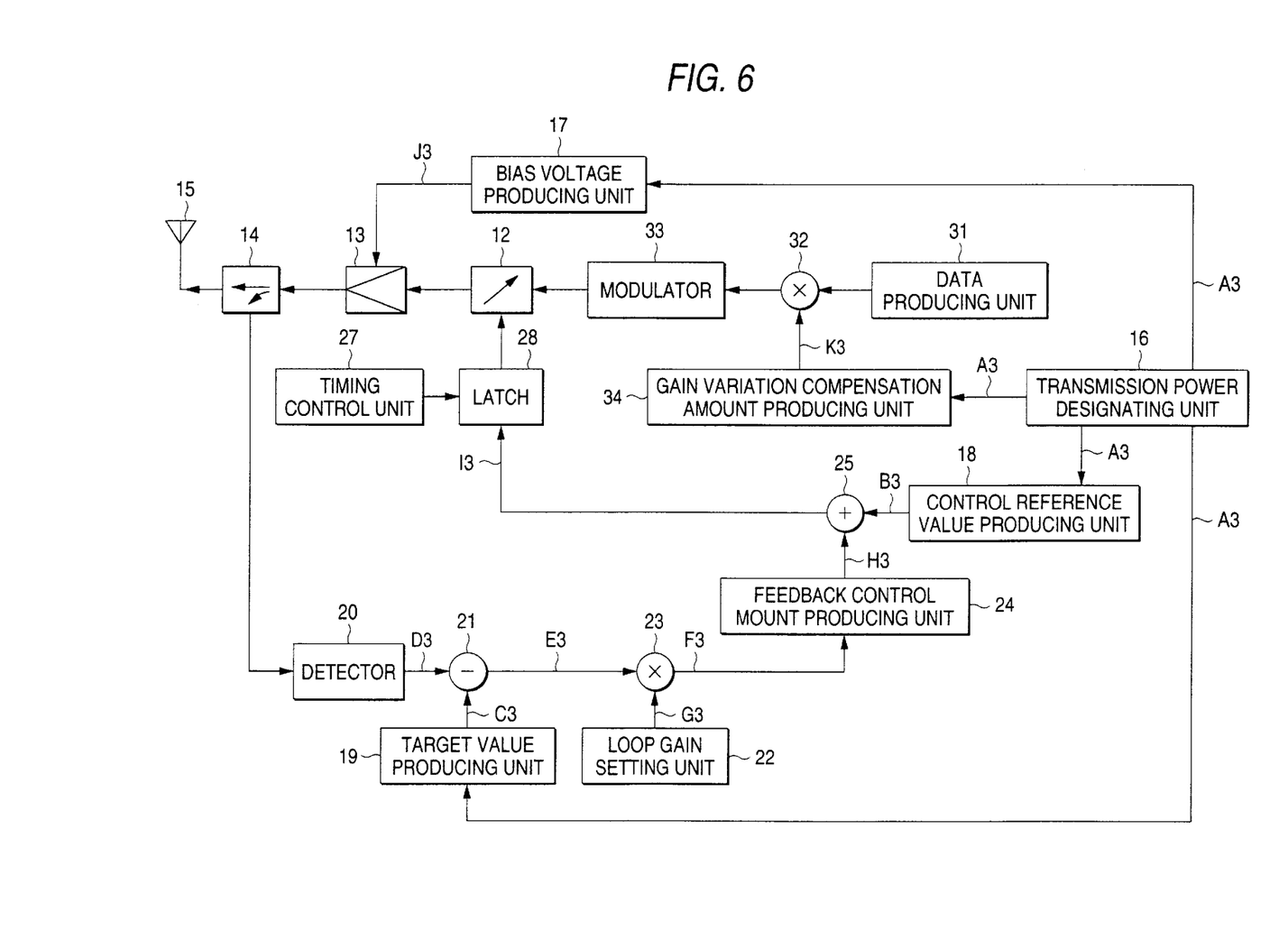
FIG. 6 is a structural diagram for mainly showing an arrangement of a transmission power control unit of a wireless communication apparatus according to a third embodiment of the present invention.

FIG. 6 is a structural diagram for mainly showing an arrangement of a transmission power control unit of a wireless communication apparatus according to a third embodiment of the present invention.

The third embodiment corresponds to a modified arrangement of the second control system related to the above-described bias current control operation and gain variation compensating operation. The arrangements of other portions and the effects thereof according to the third embodiment are similar to those of the first embodiment. Accordingly, only different point will be explained. The same reference numerals shown in the first embodiment will be employed as those for denoting the same, or similar structural elements of the third embodiment, and therefore, descriptions thereof are omitted.

In accordance with the third embodiment, as a second control system of the wireless communication apparatus, there are provided a bias voltage producing unit 17 corresponding to a current consumption adjusting means, and a gain variation compensation amount producing unit 34 and also a multiplier 32, which correspond to a gain variation compensating means. This second control system is employed so as to reduce power consumption by controlling a bias of a power amplifier when this power amplifier is operated under low output power. The multiplier 32 is provided between a data producing unit 31 and a modulator 33, which constitute a signal modulating unit. This multiplier 32 multiplies an unmodulated signal by a gain variation compensation amount "K3", so that a signal amplitude of a transmission signal is variable.

The bias voltage producing unit 17 outputs an optimum bias voltage "J3" of a power amplifier 13 in response to transmission output power. The gain variation compensation amount producing unit 34 corresponds to a compensation amount producing means, and the multiplier 32 corresponds to a signal amplitude varying means. In order that the gain variation compensation amount of the power amplifier 13, which is produced by the above-explained bias current control, may be reflected onto the multiplier 32 for compensating the gain variation, a gain variation compensation amount "K3" is outputted from the gain variation compensation amount producing unit 34 based upon the transmission power designation information "A3" derived from the transmission power designating unit 16. Then, the gain variation compensation operation is carried out by this gain variation compensation amount "K3".

In the bias voltage producing unit 17, similar to the first embodiment, the optimum bias voltage values of the power amplifier 13 are previously acquired in accordance with the transmission output power, and then, these acquired optimum bias voltage values are saved in a table and the like. A bias voltage "J3" suitable for transmission output power is outputted from this bias voltage producing unit 17 with reference to this table based upon the transmission power designation information "A3". Also, in the gain variation compensation amount producing unit 34, multiplication coefficients equivalent to error amounts from predicted gain values of the power amplifier are previously acquired in accordance with the transmission output power, and then, the acquired error amounts are saved in a table and the like. Based upon the transmission power designation information "A3", the gain variation compensation amount "K3" is outputted to the multiplier 32 for compensating the gain variation so as to be multiplied with reference to this table. Thus, the gain variation compensating operation by varying the signal amplitude of the transmission signal is carried out.

It should also be noted that each of the functional blocks such as the bias voltage producing unit 17, and the gain variation compensation amount producing unit 34 is arranged by a microprocessor (MPU) and the like. A series of control operations executed in the transmission power control unit may be realized by a software program executable on this MPU.

Similar to the first embodiment, when the transmission power control operation is carried out, based upon transmission power designation information "A3" which constitutes a power control target to be transmitted from the transmission power designating unit 16, a transmission power control reference value "B3" of the 1 control step is produced from the control reference value producing unit 18. In addition, a power control target value "C3" which constitutes a convergent target of the power precision compensation is produced by the target value producing unit 19. On the other hand, a transmission signal which is produced by the data producing unit 31 and modulated by the modulator 33 via the multiplier 32 is power-amplified in the power amplifier 13 based on the gain which is again set by the variable gain circuit 12. Thereafter, the power-amplified transmission signal is radiated via the directional coupler 14 from the transmission antenna 15 corresponding to the transmission power output terminal.

Then, a detection value "D3" outputted from the detector 20 is compared with, and is subtracted from a power control target value "C3" outputted from the target value producing unit 19 in the error detecting unit 21, so that a present transmission power error "E3" with respect to the power control target value "C3" is detected. Also, the transmission power error "E3" is multiplied by a loop gain "G3" by the loop gain multiplying unit 23 so as to obtain a feedback correction value "F3". This feedback correction value "F3" is added to each other every 1 control step in the feedback control amount producing unit 24, and then, the added feedback correction value is outputted as a feedback control amount "H3" to the control variable adding unit 25. Furthermore, the transmission power control reference value "B3" is added to the feedback control amount "H3" in the control variable adding unit 25, and then, the added value is entered as a gain control value "I3" via the later 28 to the variable gain circuit 12.

In accordance with the third embodiment, the signal amplitude is varied in response to the transmission power designation information "A3" with respect to the output of the data producing unit 31, which is equal to the unmodulated signal, by both the gain variation compensation amount producing unit 34 and the multiplier 32 for compensating the gain variation, so that the gain variation compensation operation for the power amplifier 13 is carried out by these circuits. Then, a proper bias voltage "J3" produced in response to the transmission power designation information "A3" is outputted from the bias voltage producing unit 17, so that the bias current control operation is carried out in accordance with the transmission output power in the power amplifier 13. Under this condition, the transmission signal is power-amplified by the power amplifier 13 based upon the output of the variable gain circuit 12, and the power-amplified transmission signal is outputted via the directional coupler 14 from the transmission antenna 15.

As previously explained, also in the third embodiment, similar to the first embodiment, since the bias voltage in the power amplifier is controlled, in particular, while the current consumption occurred when the power amplifier is operated under low output power can be reduced, the error contained in the transmission output power caused by the gain variation due to this bias current control can be compensated in accordance with the transmission output power. As a result, the low power consumption can be realized, and furthermore, the high-linearity transmission power control with the wide dynamic range can be realized.

As previously explained, in accordance with the embodiments, while maintaining the absolute precision of the transmission power, the transmission power control with the wide dynamic range can be realized. Furthermore, since the bias current of the power amplifier is optimized in response to the designated transmission power and also the gain variation caused by this bias current control is compensated, both the power variable amount precision and the transmission power absolute precision when the transmission power control is carried out can be compensated. As a result, while the power consumption of the transmitter can be reduced, the high-precision transmission power control operation can be carried out at the same time.

As previously explained, in accordance with the wireless communication apparatus, the transmission power control method used in this wireless communication apparatus, and the recording medium of the present invention, the error is detected based upon the difference value between the detection value obtained by detecting the transmission signal of the wireless communication apparatus and the detection value of the transmission signal when this transmission signal is transmitted under the designated transmission power to be transmitted. Then, this error is multiplied by a predetermined gain to obtain the correction value. Based on this correction value, the feedback control amount is produced. Then, based on both this feedback control amount and the reference value of the transmission power control, the gain of the transmission power amplification is again set at preselected control timing so as to control the transmission power. Furthermore, since the bias current in the power amplification is controlled in response to the designated transmission power, the current consumption may be adjusted, and furthermore, the gain variation in the transmission power amplification caused by controlling this bias current may be compensated. As a consequence, since the current consumption of the power amplifier when this power amplifier is operated under low output power is adjusted, while the power consumption of the electronic appliance can be reduced, the absolute precision of the required transmission power can be secured. Also, it is possible to realize the high-linearity transmission power control operation having the wide dynamic range.

What is claimed is:

1. A wireless communication apparatus comprising:
   transmission power designating means for designating transmission power of a transmission signal to be transmitted from said wireless communication apparatus;
   controlling reference value producing means for producing a reference value used to control transmission power based upon said designated transmission power;
   timing control means for defining control timing of said transmission power;
   error detecting means for detecting an error based upon a difference value between a detection value obtained by detecting the transmission signal of said wireless communication apparatus and a detection value of a transmission signal when said transmission signal is transmitted under said designated transmission power;
   gain multiplying means for multiplying said detected error by a predetermined gain to obtain a correction value;
   control amount producing means for producing a feedback control amount based upon said correction value;
   power adjusting means for again setting a gain in a transmission power amplification at said control timing based upon said reference value for controlling the transmission power and said feedback control amount so as to adjust the transmission power;
   power amplifying means for power-amplifying said transmission signal;
   current consumption adjusting means for adjusting a current consumption in such a manner that a bias voltage is applied to said power amplifying means in response to said designated transmission power so as to control a bias current in said power amplifying means; and
   gain variation compensating means for compensating a variation in gains when the variation of said gains occurs in the transmission power amplification by controlling said bias current.

2. A wireless communication apparatus as claimed in claim 1 wherein said gain variation compensating means includes: gain adjusting means for adjusting both said reference value used to control the transmission power and said gain control value based on the feedback control amount in response to said designated transmission power in said power adjusting means.

3. A wireless communication apparatus as claimed in claim 1 wherein said gain variation compensating means includes compensation amount producing means for producing a gain variation compensation amount in response to said designated transmission power; and variable gain means for varying a gain based upon said gain variation compensation amount at output means of said power adjusting means.

4. A wireless communication apparatus as claimed in claim 1 wherein: said gain variation compensating means includes compensation amount producing means for producing a gain variation compensation amount in response to said designated transmission power; and signal amplitude varying means for varying a signal amplitude of said transmission signal based on said gain variation compensation amount.

5. A transmission power control method used in a wireless communication apparatus, comprising:
   a transmission power designating step for designating transmission power of a transmission signal to be transmitted from said wireless communication apparatus;
   a controlling reference value producing step for producing a reference value used to control transmission power based upon said designated transmission power;
   a timing control step for defining control timing of said transmission power;
   an error detecting step for detecting an error based upon a difference value between a detection value obtained by detecting the transmission signal of said wireless communication apparatus and a detection value of a transmission signal when said transmission signal is transmitted under said designated transmission power;
   a gain multiplying step for multiplying said detected error by a predetermined gain to obtain a correction value;
   a control amount producing step for producing a feedback control amount based upon said correction value;
   a power adjusting step for again setting a gain in a transmission power amplification at said control timing based upon said reference value for controlling the transmission power and said feedback control amount so as to adjust the transmission power;
   a power amplifying step for power-amplifying said transmission signal;
   a current consumption adjusting step for adjusting a current consumption in such a manner that a bias voltage is applied in response to said designated transmission power so as to control a bias current in said power amplifying step; and
   a gain variation compensating step for compensating a variation in gains when the variation of said gains occurs in the transmission power amplification by controlling said bias current.

6. A transmission power control method used in a wireless communication apparatus as claimed in claim 5 wherein said gain variation compensating step includes a gain adjusting step for adjusting both said reference value used to control the transmission power and said gain control value based on the feedback control amount in response to said designated transmission power in said power adjusting step.

7. A wireless communication apparatus as claimed in claim 5 wherein said gain variation compensating step includes a compensation amount producing step for producing a gain variation compensation amount in response to said designated transmission power; and a variable gain step for varying a gain based upon said gain variation compensation amount at an output of said power adjusting step.

8. A wireless communication apparatus as claimed in claim 5 wherein said gain variation compensating step includes a compensation amount producing step for producing a gain variation compensation amount in response to said designated transmission power; and a signal amplitude varying step for varying a signal amplitude of said transmission signal based on said gain variation compensation amount.

9. A recording medium readable by a computer, for recording thereon the transmission power control method used in the wireless communication apparatus as recited in any one of claims 5 to 8 as a program executed by the computer.

* * * * *